United States Patent
Mastipuram et al.

(10) Patent No.: US 7,430,140 B1
(45) Date of Patent: Sep. 30, 2008

(54) METHOD AND DEVICE FOR IMPROVED DATA VALID WINDOW IN RESPONSE TO TEMPERATURE VARIATION

(75) Inventors: Ritesh Mastipuram, Santa Clara, CA (US); Rajesh Manapat, San Jose, CA (US); Chor Fung Chia, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 538 days.

(21) Appl. No.: 11/234,647

(22) Filed: Sep. 23, 2005

Related U.S. Application Data

(60) Provisional application No. 60/613,101, filed on Sep. 24, 2004.

(51) Int. Cl.
*G11C 7/00* (2006.01)
(52) U.S. Cl. ............... 365/189.17; 365/194; 365/211; 327/176
(58) Field of Classification Search ............ 365/189.17, 365/194, 240, 189.12, 211; 327/176
See application file for complete search history.

(56) References Cited

U.S. PATENT DOCUMENTS

| | | | |
|---|---|---|---|
| 5,402,389 A | 3/1995 | Flannagan et al. | |
| 5,498,977 A | 3/1996 | Pickup | |
| 5,656,947 A | 8/1997 | Opris | |
| 5,917,353 A | 6/1999 | Teel | |
| 6,215,726 B1* | 4/2001 | Kubo | 365/233.17 |
| 6,294,937 B1 | 9/2001 | Crafts et al. | |
| 6,369,652 B1 | 4/2002 | Nguyen et al. | |
| 7,173,501 B1 | 2/2007 | Varricchlone | |
| 2002/0099987 A1* | 7/2002 | Corbin et al. | 714/718 |

* cited by examiner

*Primary Examiner*—Son Dinh
*Assistant Examiner*—Toan Le
(74) *Attorney, Agent, or Firm*—Haverstock & Owens, LLP

(57) ABSTRACT

A memory architecture and a method of operating the same can provide a substantially constant data valid window (DVW) irrespective of a temperature for the memory device. Generally, a memory device can receive an access request, determine a temperature of the memory device, and switch a number of delay elements in an output buffer in response to the temperature of the memory device. In one embodiment, a memory device can have a multi-stage input-output (I/O) buffer and an automatic temperature compensated circuit that samples a temperature of the memory and then switches a number of delay elements in the I/O buffer into a data path between the memory and the output to provide a substantially constant DVW over changes in temperature.

20 Claims, 10 Drawing Sheets

METHOD AND DEVICE FOR IMPROVED DATA VALID WINDOW IN RESPONSE TO TEMPERATURE VARIATION

This application claims the benefit of U.S. Provisional Patent Application Ser. No. 60/613,101, filed on Sep. 24, 2004.

TECHNICAL FIELD

The present invention relates generally to memory devices, and more particularly to data access operations for random access memories (RAMs), and a method of operating the same to provide a substantially constant data valid window for a memory system irrespective of a temperature of the device.

BACKGROUND OF THE INVENTION

Memory devices, including semiconductor memories such as static random access memories (SRAMs), can typically include a large number of circuit elements, e.g., transistors, formed in or above a substrate. In operation, such memory devices can typically output data and input data at relatively high speeds. When operating synchronously (i.e., according to timing based on a provided clock signal), the output and/or input of data can be timed relative to a timing signal. In such cases, there may be a "set-up" time during which data is valid prior to a clock edge, as well as a "hold-time" during which data is valid after such a clock edge. This presents a "data valid window" during which a data access can be valid.

As memory devices operate at higher and higher clock speeds, it can be more difficult to ensure a sufficient data valid window. Having a large enough data window is important for reliable operation of a memory interface in a system. To illustrate this, a conventional semiconductor memory device will now be described.

Referring now to FIG. 8, a conventional memory is shown in a block schematic diagram, and designated by the general reference character 800. A conventional memory device 800 can typically include an array of memory cells 802, address decoding circuitry for selecting memory cells for reading or writing data, and sensing circuitry for detecting or reading the content or data stored in the selected cells (not shown).

A memory device 800 can also include input/output (I/O) circuitry, including an I/O buffer 804 and an I/O driver 806. While FIG. 8 shows I/O circuitry for sending data from the memory device 800, one skilled in the art would recognize that such circuitry can also receive data for the memory device 800. Such conventional I/O circuitry can drive output data and/or latch input data according to a "valid window" specification.

A conventional memory 800 typically operates in conjunction with a memory controller. One such conventional arrangement is shown in FIG. 9. FIG. 9 is a block schematic diagram of a conventional memory system designated by the general reference character 900. A conventional memory system 900 can include a memory controller 902 and a memory device 904, which in this example is an SRAM. A memory controller 902 can control the memory device 904 by providing commands that enable various operations, including but not limited to read and write operations. Such command can be issued and/or latched on the edge of a system clock CLK.

As will be recalled, accessing a memory device 904 can require capturing data from an I/O driver during a particular time period (e.g., data valid window (DVW)) that is determined in relative to a timing signal. In the conventional example of FIG. 9, a timing signal can be clock signal CLK used by both a memory device 904 sending/receiving data, as well as a device requesting/sending data to a memory device 904. In the event data is captured outside of a DVW, the data accessed may be erroneous.

While memory devices may provide a particular response under ideal conditions, many times external factors, such as temperature drifts or other fluctuations in the operating conditions of a controller and/or memory device, can affect the operation of a memory system 900. In particular, a speed of a memory device 904 can be affected. Consequently, the time at which a DVW begins and the duration of the DVM can be adversely affected due to variations in operating conditions (e.g., process variations, ambient temperature, operating voltage or "PVT").

To assist in synchronizing operations between devices, a conventional memory system 900 can often include some sort of synchronization circuit that utilizes a feedback signal between a memory controller 902 and memory device 904, such as a delay locked loop or phase locked loop type circuit. For example, according to such a feedback signal, a memory controller 902 can delay an enable signal (e.g., output enable OE, write enable WE, address strobe ADS, synchronous read/write R/W, to name but a few).

The above use of timing circuits can be an improvement over previous designs without such feedback, and can account or compensate for variations in delays of enable signals from a memory controller 902. However, it is not wholly satisfactory for a number of reasons.

In particular, current generation memory devices, for example synchronous SRAMs, are not know to have a method or circuit for controlling a DVW when an ambient temperature of the device, either increases or decreases. Thus, feedback loops and the like may not be able to compensate for such variations.

Moreover, as operating frequency of memory devices and systems increases, a DVW can become increasingly more critical. Higher operating speeds result in smaller available time periods for a DVW. Any unwanted reductions, due to PVT variations, may result in an impractically small DVW.

Temperature variations, in particular, may present unwanted changes in a DVW. As is well known, integrated circuit memory devices are formed with transistors. The inherent characteristic of a transistor is to slow down as temperature increases and get faster as it decreases. This can affect the propagation speed of data along a data path of the memory device, and hence timing for the output and input of data to the device. At higher temperatures, a start time of a DVW in relation to a clock can be shifted forward (e.g., occur later in time). Conversely, as temperature decreases and the speed of the memory device increases, there may not be enough output hold time (Tdoh) to enable an external circuit to latch data from the memory device.

One example of dependence of a DVW on an operating temperature of a memory device is illustrated in FIGS. 10A and 10B. FIG. 10A is a timing diagram of a DVW of a conventional memory system. FIG. 10B is a description of the timing diagram of FIG. 10A. The timing values of FIGS. 10A and 10B show the following: a "clock rise to data valid time" Tco and a data output hold time Tdoh.

Variations due to a "hot" temperature include a change in Tco, shown as D_Tco(hot), and a change in Tdoh, shown as D_Tdoh(hot).

Variations due to a "cold" temperature include a change in Tco, shown as D_Tco(cold) and a change in Tdoh, shown as D_Tdoh(cold).

It is understood that the variations due to temperature changes are not necessarily the same for both hot and cold temperatures. That is, D_Tco(hot) will be the same as D_Tco (cold), and D_Tdoh(hot) will be the same as D_Tdoh(cold) only by coincidence.

FIG. 10B illustrates how delays in speed for hot conditions can increase a set-up time and a hold time. Similarly, FIG. 10B shows how increased speed for hot conditions can decrease a set-up time and a hold time.

Accordingly, there is a need for a memory device and/or memory device architecture that includes some mechanism for controlling a DVW such that a DVM for the device can be substantially unaffected by variations in temperature of the device.

SUMMARY OF THE INVENTION

The present invention can provide a solution to these and other problems, and offers further advantages over conventional synchronous memory devices and methods of operating the same.

The present invention can include a method of accessing data stored in a semiconductor memory having a multi-stage input-output (I/O) buffer and a temperature compensated circuit. The method can include sampling a temperature of the memory, and switching a number of delay elements in the I/O buffer into a data path between the memory and an output. Such a switching of delay elements can be in response to the sampled temperature, and can output from the I/O buffer a data signal having a substantially constant data valid window (DVW) relative to a timing signal over variations in the temperature of the memory.

In this way, as temperature affects a propagation speed of an I/O buffer, lesser or greater numbers of delay elements can be switched into the I/O buffer to compensate for such changes in operating speed.

According to one aspect of the present invention, sampling a temperature of the memory can include generating a temperature value with an automatic temperature compensated circuit that automatically generates a temperature value. In addition, the step of switching the number of delay elements can include enabling delay elements in response to the temperature value.

In this way, temperature effects on an I/O data buffer can be automatically compensated for by switching in fewer or greater numbers of delay elements.

According to another aspect of the embodiments, a temperature value can be a binary value. In addition, the step of switching the number of delay elements can include decoding the binary value into a plurality of enable signals, and enabling delay elements in response to the enable signals.

In this way, delay elements can be enabled based on a decoded temperature value.

According to another aspect of the embodiments, the number of delay elements switched into the data path can be inversely proportional to the sampled temperature of the device.

In this way, delay elements can be switched in counter the effects of temperature on transistor speeds.

According to another aspect of the embodiments, the step of switching the number of delay elements in the I/O buffer can include coupling a predetermined resistance between a data output node and a power supply voltage. In one arrangement, the resistance can be inversely proportional to the sampled temperature of the device.

In this way, different resistance values can be used to introduce different delays into a data path.

The present invention can also include a method of operating a semiconductor memory. The method can include generating a temperature value based on the operating temperature of the semiconductor memory. The method can also include enabling selected of a plurality of delay elements disposed in a data path to an outside connection of the semiconductor memory. Such delay elements can compensate for changes in signal propagation time arising from variations in the operating temperature. The number of enabled devices can correspond to the generated temperature value.

According to another aspect of the embodiments, generating the temperature value can include monitoring a capacitor voltage. If the capacitor voltage falls below a predetermined low voltage, the amount of current supplied to the capacitor can be increased. If the capacitor voltage rises above a predetermined high voltage, the amount of current supplied to the capacitor can be decreased. A rate signal can be generated based on the rate at which the capacitor falls below the predetermined low voltage and rises above the predetermined high voltage. Finally, the temperature value can be generated from the rate signal.

In this way, a temperature of a semiconductor memory can be automatically detected according to a charging and/or discharging rate of a capacitor.

According to another aspect of the embodiments, the temperature value can be a code. In addition, enabling the selected delay elements can include decoding the code into a plurality of decode signals, and enabling the selected delay elements in response to the decode signals.

According to another aspect of the embodiments, enabling the selected delay elements can include coupling a resistance between a data output node and a first power supply. The resistance can be based on the temperature value.

According to another aspect of the embodiments, a method can further include providing a plurality of resistive paths between a data node and a power supply voltage, each resistive path comprising a different resistance value. In addition, the step of enabling selected of a plurality of delay elements can include enabling one of the resistive paths in response to the temperature value.

According to another aspect of the embodiments, the step of providing the plurality of resistive paths can include forming a plurality of different resistor legs in parallel between a power supply node and a data output node, each resistor leg being separately enabled.

In this way, different selectable resistance values can be provided via resistance value established via metallization option.

According to another aspect of the embodiments, the step of enabling selected of the plurality of delay elements includes, in response to a pull-up signal, coupling a data output node to a first supply voltage via one of a plurality of pull-up resistive paths, each pull-up resistive path having a different resistance value.

The present invention can also include a semiconductor memory having a multi-stage data buffer with a plurality of delay elements therein. Different delay elements can be switched into a data path in response to switch control signals. The semiconductor memory can also include a temperature compensation circuit comprising a temperature sampling section that samples a temperature of the semiconductor memory device, and a switch control circuit that generates the switch control signals. The switch control signals can vary according to the sampled temperature to introduce a delay into a data path to provide a substantially constant data valid window relative to a data request in response to variations in the sampled temperature.

In this way, a semiconductor memory can include a temperature compensation circuit for adjusting a data path delay according to a temperature of the semiconductor memory device.

According to one aspect of the embodiments, a multi-stage data buffer can formed on a first semiconductor substrate, and a temperature compensation circuit can be formed on a separate second substrate adjacent to the first substrate. The first and second substrates can be formed in the same integrated circuit package as the first semiconductor substrate.

In this way, a temperature compensation circuit can be formed as a separate integrated circuit included in the same package as a memory device.

According to one aspect of the embodiments, a multi-state data buffer and the temperature compensated circuit can formed on the same substrate.

Such an arrangement can allow for a compact device.

According to one aspect of the embodiments, a switch control circuit can generate switch control signals that switch a first number of delay elements into the data path when the sampled temperature is a first temperature, and switch a second number of delay elements into the data path when the sampled temperature is a second temperature. The second temperature can be lower than the first temperature, and the second number of delay elements can be greater than the first number of delay elements.

According to another aspect of the embodiments, a decoder can be coupled between the multi-stage data buffer and the temperature compensation circuit. The decoder can decode switch control signals to generate switch activation signals. Each switch activation signal can switch a different number of delay elements into the data path. In one very particular arrangement, a switch control circuit can generate a different set of switch control signal values, and each switch activation signal can correspond to a different range of temperatures.

According to another aspect of the embodiments, a multi-stage data buffer can comprise a plurality of delay sections. Each delay section can include a plurality of resistive elements coupled between a data node and a power supply voltage. The overall effective resistance of the resistance elements for each delay section can be different.

BRIEF DESCRIPTION OF THE DRAWINGS

Various features and advantages of the disclosed embodiments of the present invention will be apparent upon reading of the following detailed description in conjunction with the accompanying drawings and the appended claims provided below, where:

DETAILED DESCRIPTION

The various embodiments of the present invention are directed to a semiconductor memory device and a method of operating the same that can provide a substantially constant data valid window (DVW) irrespective of temperature variations temperature in the device. The architecture and method of the present invention can be particularly useful in high speed synchronous memory device, such as synchronous static random access memories (SRAMs).

As noted above, conventional semiconductor memories or memory devices do not include a mechanism for controlling data input/output (I/O) operations according to temperature. In contrast, a memory device of the present invention can include an automatic temperature compensated circuit and a multi-stage input-output (I/O) buffer.

Generally, a substantially constant DVW over variations in temperature can be accomplished in the embodiments by including a temperature compensated circuit, which may be an embedded circuit, and multi-stage I/O buffer in the memory device having a number of delay elements. It is understood that, as used herein, the term "I/O buffer" can refer to both a bi-directional data path as well as a single direction path.

A temperature compensated circuit can sense an ambient temperature of a memory device and activate an appropriate control value. The control value can be programmed to activate at a predetermined or set temperature range. This control value can then be fed as an input to a multi-stage output driver that can control the numbers of delay elements activated in a data path.

At temperatures that are relatively high with respect to some nominal temperature, a memory device operation can get slower and a lesser number of delay elements can be activated resulting in a data path that is faster. At temperatures that are relatively low with respect to the nominal temperature, the memory device operation can get faster and a larger number of delay elements can be activated, resulting in data being delayed appropriately.

Various embodiments of the present invention will now be described in greater detail below. For purposes of clarity, many of the details of semiconductor memory devices and methods of operating the same that are widely known and are not relevant to the present invention have been omitted from the following description.

Figure 1:
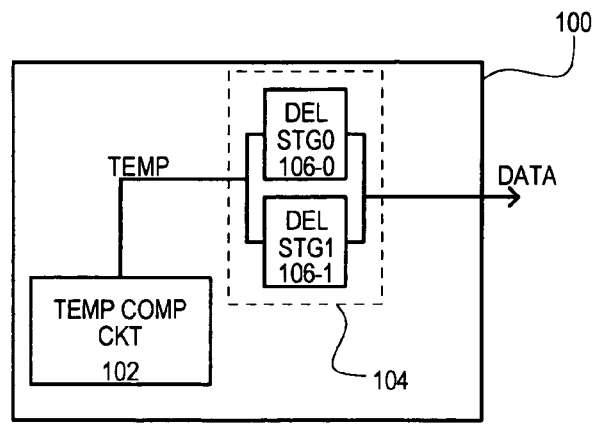
FIG. 1 is a functional block diagram of a memory device according to a first embodiment of the present invention.

Referring now to FIG. 1, a functional block diagram of a memory device according to a first embodiment is shown. A memory device 100 can include a memory array and I/O driver (both not shown). A memory device 100 can further include a temperature compensated circuit 102 and a multi-stage I/O buffer 104. A temperature compensated circuit 102 can be on fabricated on the same substrate as a memory array, I/O buffer 104 and I/O driver. Alternatively, a temperature compensated circuit 102 can be on fabricated on a separate substrate that can be disposed adjacent to a substrate containing a memory array, I/O buffer 104 and I/O driver, and packaged therewith. Preferably, a temperature compensated circuit 102 is formed on the same substrate (i.e., embedded).

A temperature compensated circuit 102 can be configured or adapted to switch a number of delay elements or buffers in a data path between a memory array and an external connection to the memory device 100. The number of particular elements or buffers that are switched can be in response to a sampled temperature.

Thus, referring to FIG. 1, in response to one value of TEMP, a multi-stage I/O buffer 104 can switch in a first set of delay elements resulting in a first stage type delay 106-0 being enabled, while a second stage type delay 106-1 is disabled. In response to a second value of TEMP, multi-stage I/O buffer 104 can switch in a second delay elements resulting in a second stage type delay 106-1 being enabled.

In this way, different delays amounts can be introduced into a data path of a semiconductor memory device based on a temperature value measured for such a device.

Figure 2:
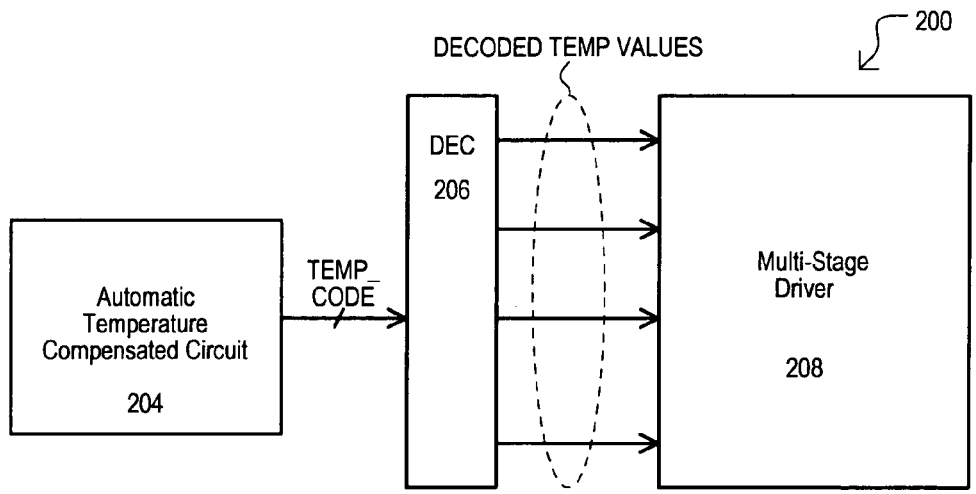
FIG. 2 is a block schematic diagram of another embodiment of the present invention.

Referring now to FIG. 2, another embodiment is described in a block schematic diagram and designated by the general reference character 200. A memory device circuit 200 can include an automatic temperature compensated circuit 204, a decoder 206 and a multi-stage driver circuit 208. A decoder 206 can be situated between a temperature compensated circuit 204 and multi-stage driver circuit 208. A temperature compensated circuit 204 can provide one of a number of predetermined codes to a decoder 206 in response to a sampled temperature for a memory device. A decoder 206 can enable a number of delay elements (or buffers) within a multi-stage driver buffer corresponding to such a code.

In one very particular embodiment, each of predetermined code can be associated with a predetermined range of temperatures. Further, a temperature compensated circuit can be configured to: (i) identify which predetermined range of temperatures encompasses a sampled temperature; and (ii) provide a predetermined code associated with the identified predetermined range of temperatures to the decoder.

In this way, different delays amounts can be introduced into a data path of a semiconductor memory device by decoding a temperature value representing a sampled temperature of a memory device.

Figure 3:
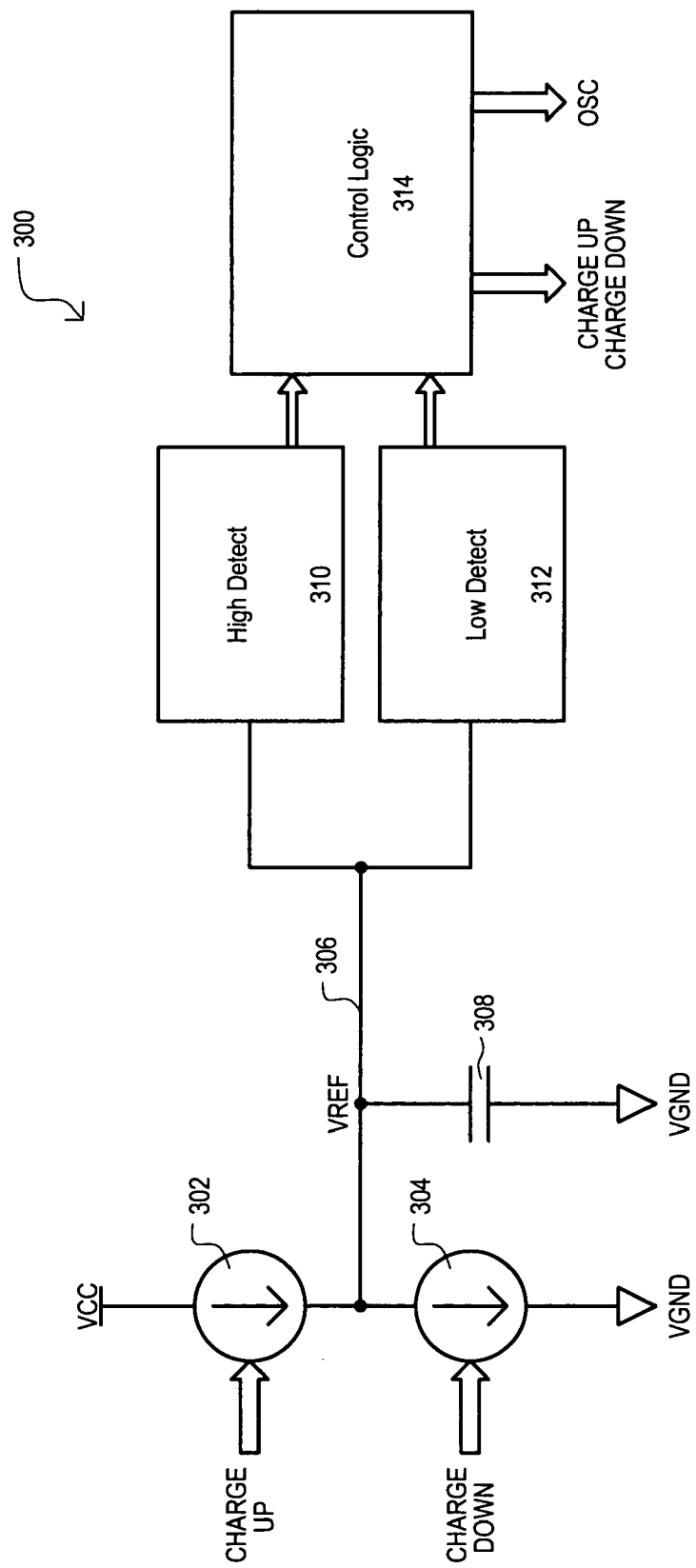
FIG. 3 is a block schematic diagram of a temperature compensated circuit that can be used in the embodiments of the present invention.

An exemplary embodiment of a temperature compensated circuit will now be described with reference to FIG. 3. FIG. 3 shows a block schematic diagram of an automatic temperature compensated circuit 300 that can be used in the embodiments described above. An automatic temperature compensated circuit 300 can include a charge up current supply 302, a charge down current supply 304, a reference node 306, and a reference voltage capacitor 308. A charge up current supply 302 can be coupled between a high voltage VCC and reference node 306, and can supply a current to a reference node 306 in response to a charge up value CHARGE UP. A charge down supply 304 can be coupled between reference node 306 and a low voltage VGND, and can discharge current from a reference node 306 in response to a charge down value CHARGE DOWN.

An automatic temperature compensated circuit 300 can also include a high detect circuit 310, a low detect circuit 312 and control logic 314. A high detect circuit 310 can be coupled to receive a potential VREF at reference node 306. When a potential VREF exceeds a high predetermined limit, high detect circuit 310 can provide a high detect indication. In a similar fashion, a low detect circuit 312 can be coupled to receive a potential VREF at reference node 306. When a potential VREF falls below a predetermined low limit, low detect circuit 312 can provide a low detect indication. Control logic 314 can generate CHARGE UP and CHARGE DOWN signals in response to outputs from the high and low detect circuits (310 and 312). In addition, control logic 314 can output an oscillator signal OSC that can represent the rate at which reference node 306 is being charged and discharged.

In such an arrangement, as a temperature changes, a resulting oscillator signal OSC can represent a sampled temperature. Further, such a value can be input into a counter circuit to generate a binary count value representing a sampled temperature, as but one example.

In this way, a sampled temperature value can be generated automatically.

While multi-stage I/O buffers can take a variety of forms, particular embodiments of such circuits will now be described in detail. Such embodiments can be considered related to the above embodiments, in that such circuits can be used as multi-stage I/O buffers in any of the above embodiments.

Figure 4:
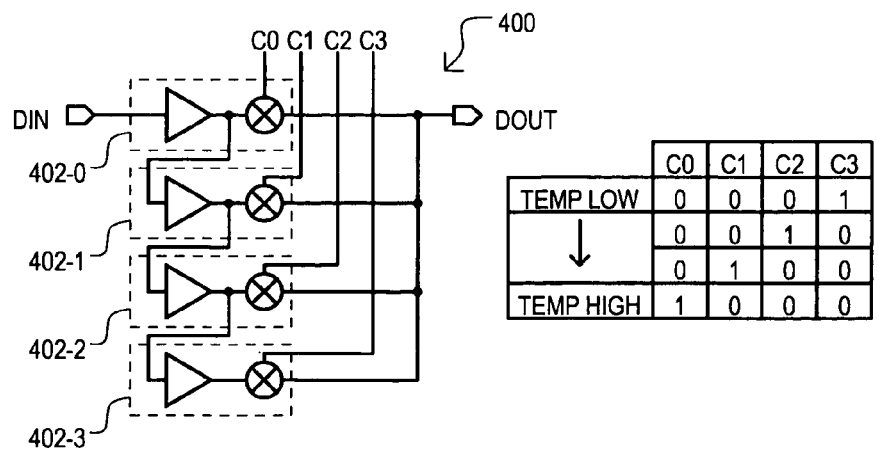
FIG. 4 is a block schematic diagram of a multi-stage input/output (I/O) according to an embodiment of the present invention.

Referring now to FIG. 4, a first example of a multi-stage I/O buffer is set forth in a block schematic diagram and designated by the general reference character 400. A multi-stage I/O buffer 400 can include a number of delay buffers 402-0 to 402-3 that can be enabled in response to a temperature value TEMP. As but one example, at a hot temperature a higher of the numbered of signals (C0 to C3) can be enabled. Conversely, at a low temperature a lower of the numbered of signals (C0 to C3) can be enabled. Of course, while FIG. 4 shows four delay buffers (402-0 to 402-3), other arrangements can include fewer or larger numbers of delay buffers.

In this way, a different number of buffers can be enabled in response to different temperature values.

Figure 5:
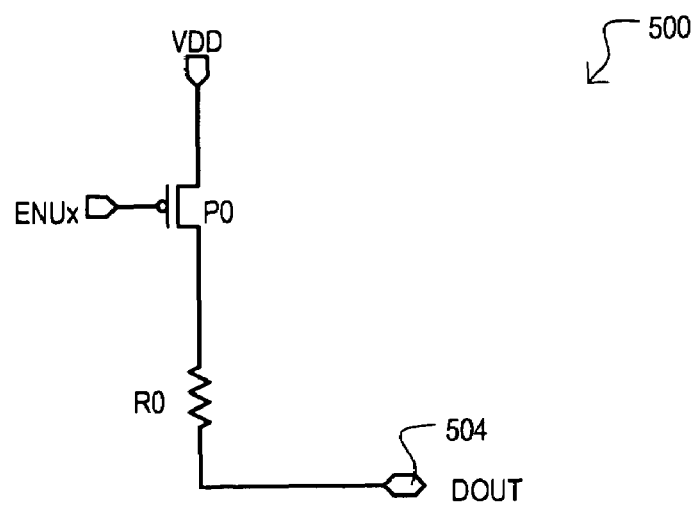
FIG. 5 is a schematic diagram of a buffer stage according to an embodiment of the present invention.

Referring now to FIG. 5, a second example of a multi-stage I/O buffer is set forth in a schematic diagram and designated by the general reference character 500. FIG. 5 is a schematic diagram of a portion of memory device according to an embodiment of the present invention having a temperature compensated circuit for providing a substantially constant data valid window (DVW) irrespective of a temperature of the device.

FIG. 5 shows a buffer stage that can be repeated with different variations to provide different delays into a pull-up path. A buffer stage 500 can include a resistor R0 that can be enabled in response to an enable signal. Different resistance values can be established for different buffer legs by changing the resistance presented by R0 for each different leg.

Resistor R0 can be situated between a data node 504 and a pull-up transistor P0. Pull-up transistor P0 can have a source-drain path connected between a high power supply VDD and resistors R0 to R7. Transistor P0 can be enabled in response to a pull-up signal ENUx. Thus, when ENUX transitions low, data node 504 can be driven high. The speed at which such a pull-up operation takes place can vary according to resistance established by resistor R0.

Of course, a similar set of resistive paths can be included to provide pull-down paths. Preferably such paths can include n-channel transistors that connect resistors between a data node and a low power supply.

In this way, variations in output delay can be introduced by providing different resistive paths to a data node, with one resistive path being enabled in response to a particular temperature or temperature range.

Figure 6A:
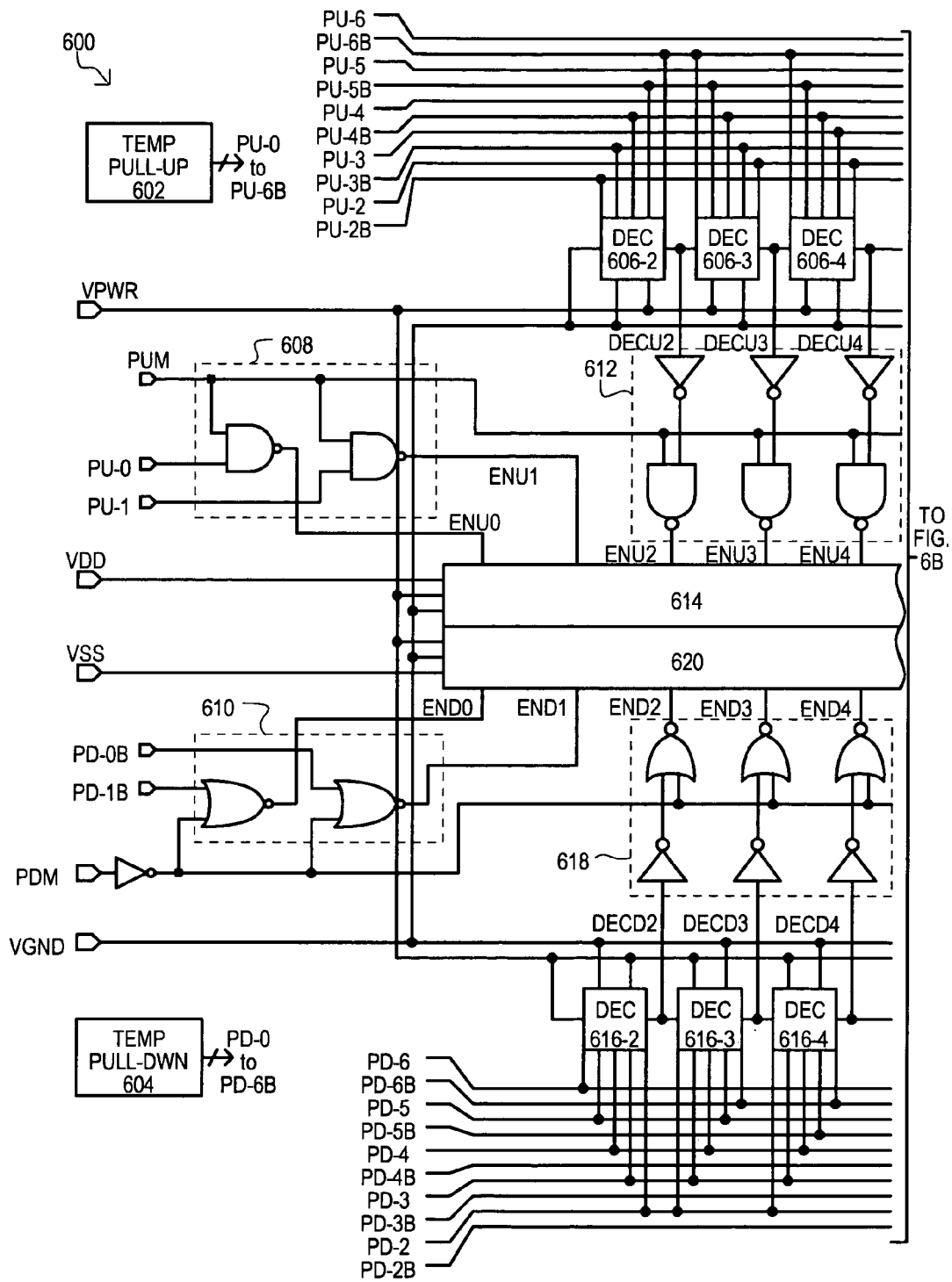
FIGS. 6A to 6E show a block schematic diagram of an output driver portion according to an embodiment of the present invention.
Figure 6B:
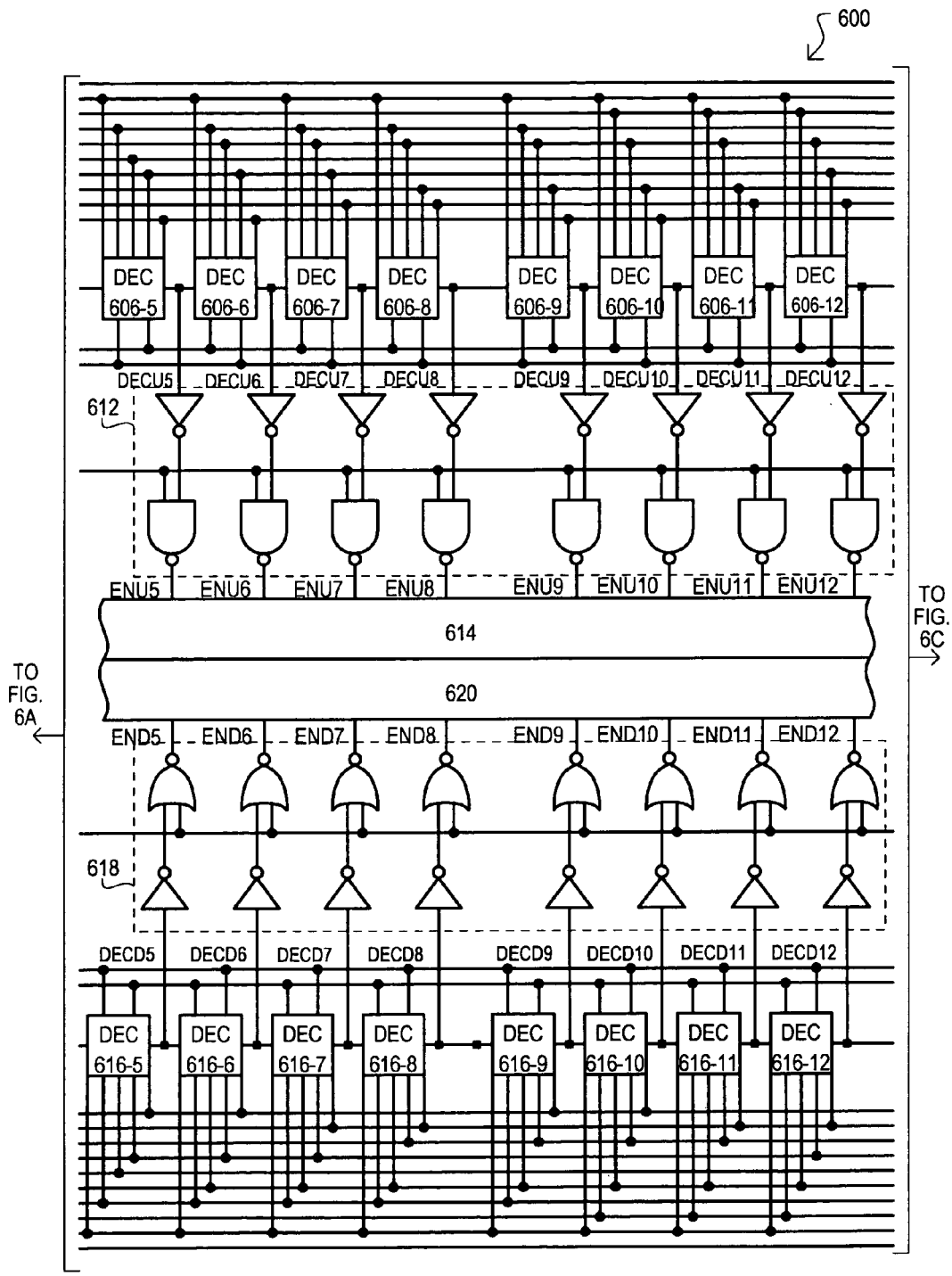
Figure 6C:
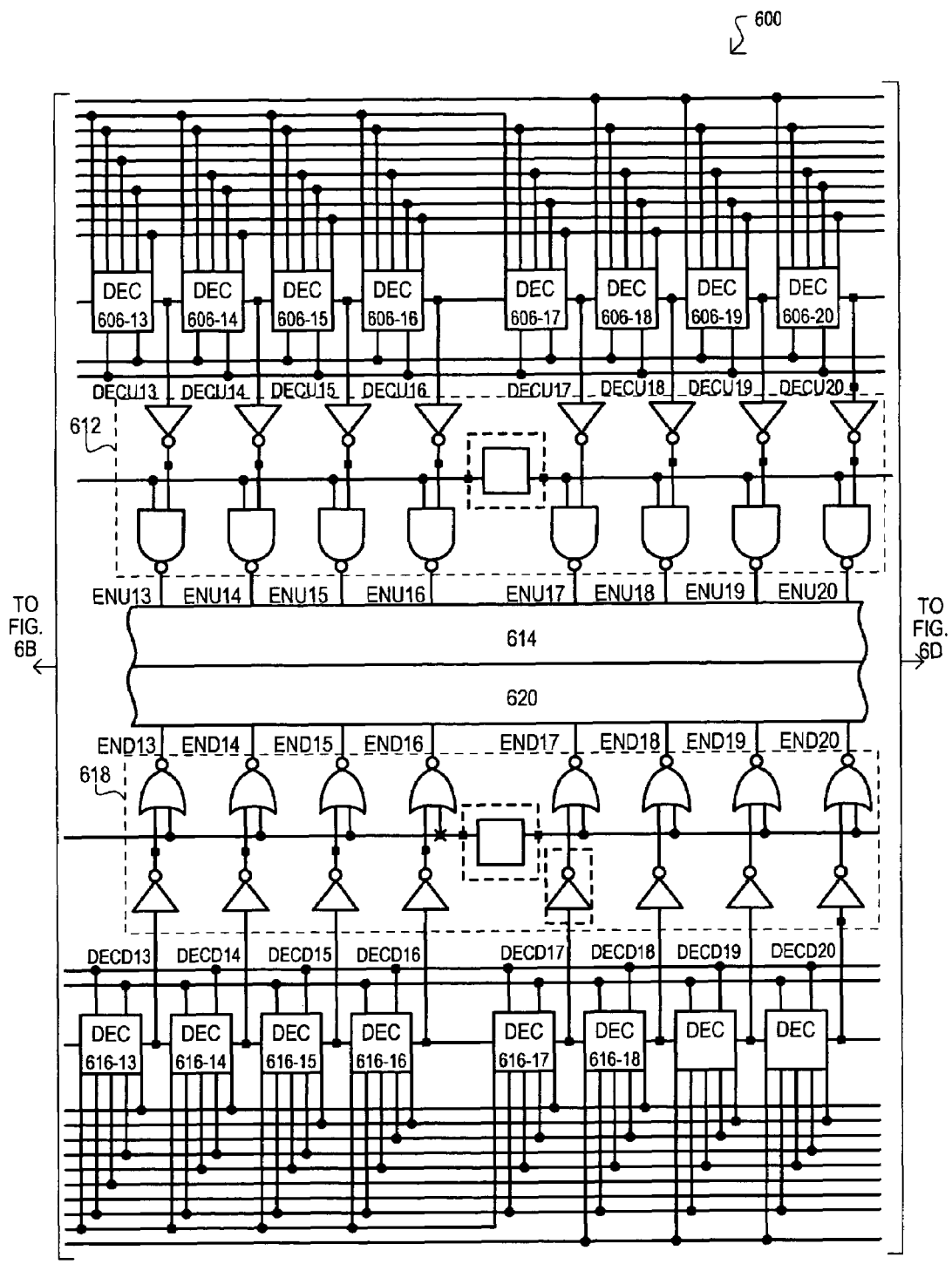
Figure 6D:
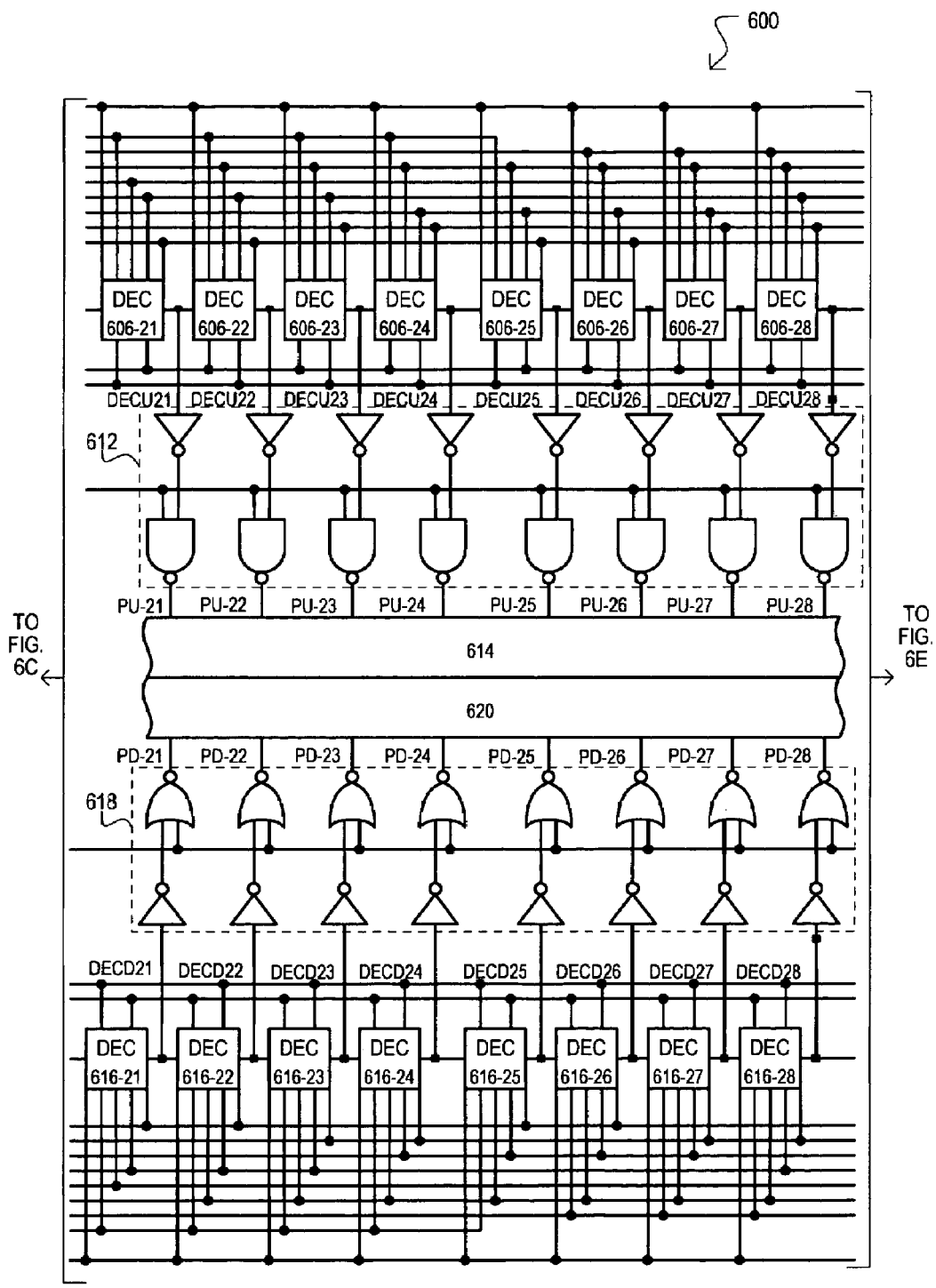
Figure 6E:
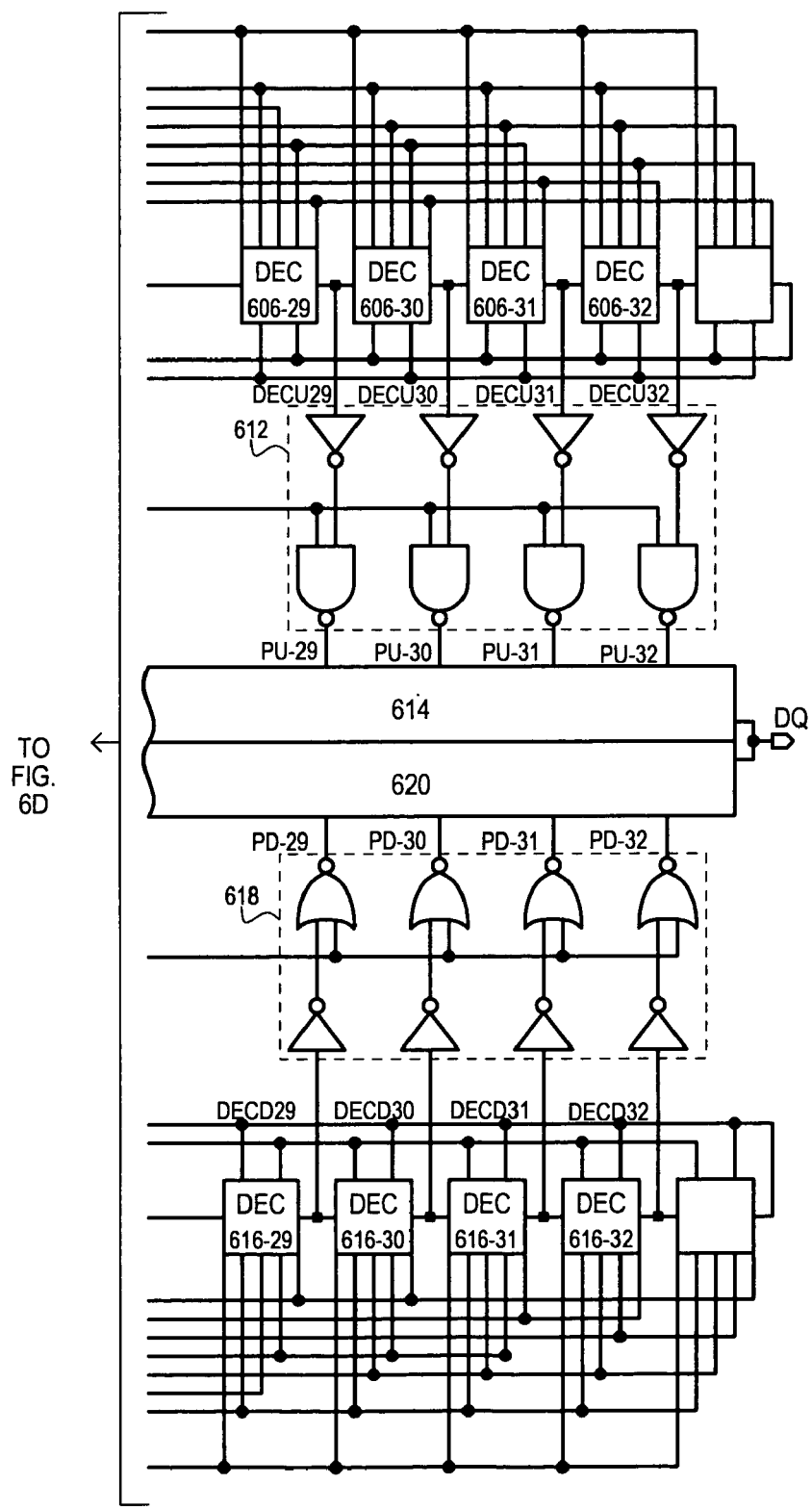
Figure 8:
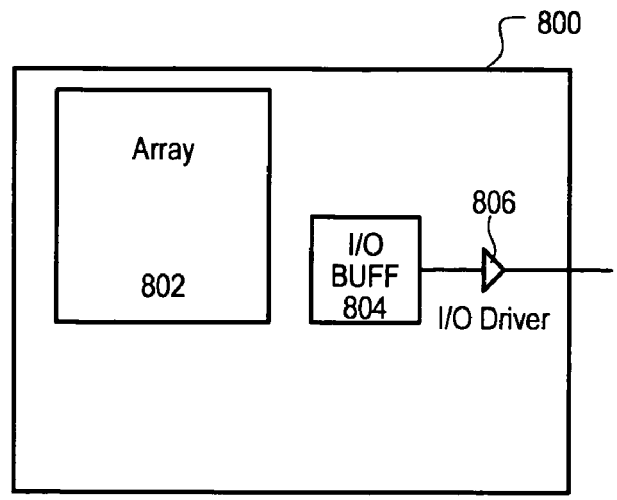
FIG. 8 is a functional block diagram of a conventional memory device having an input/output (I/O) path.
Figure 9:
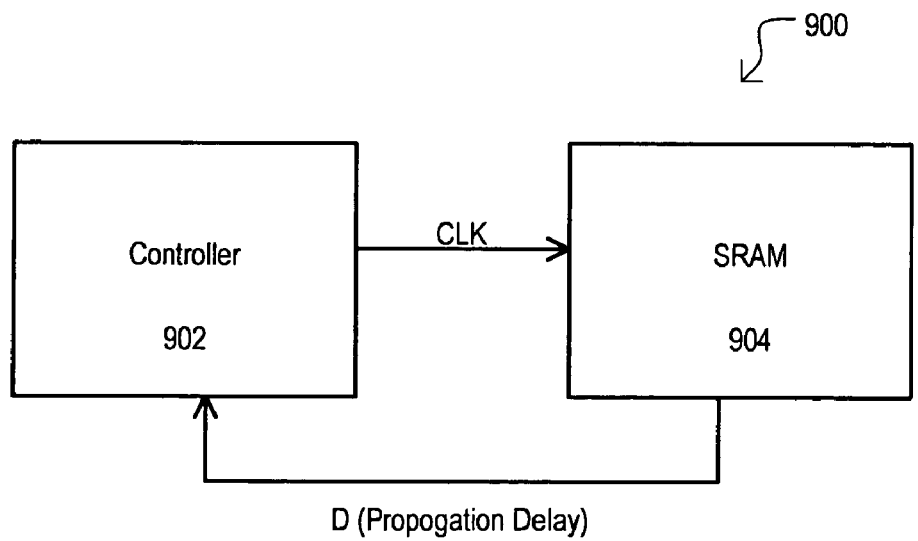
FIG. 9 is a functional block diagram of a conventional memory system.
Figures 10A, 10B:
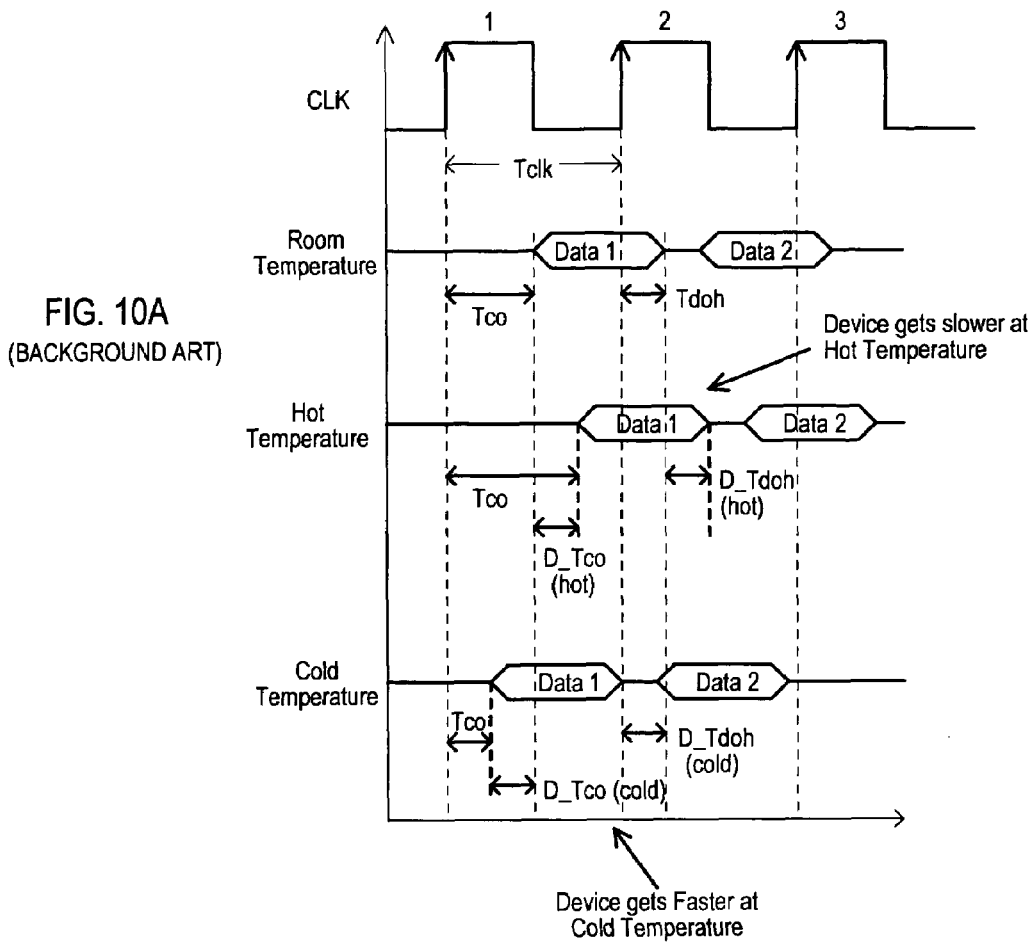
FIG. 10A is a timing diagram showing the dependence of a data valid window (DVM) on temperature in a conventional memory device.
FIG. 10B is a table describing the timing value shown FIG. 10A.

Referring now to FIGS. 6A to 6E, a schematic diagram shows a portion of memory device according to another embodiment of the present invention having a temperature compensated circuit for providing a substantially constant DVW irrespective of a temperature of the device. FIGS. 6A to 6E are different sections of the same overall circuit. The orientation of such figures with respect to one another is shown at the bottom of FIG. 6A.

FIGS. 6A to 6E together show an output driver portion 600 set that can provide different driving delay based on a decoded temperature value. Referring to FIG. 6A, an output driver portion 600 can include a temperature value circuit 602 that can receive a temperature value, and in response thereto, output pull-up values PU-0 to PU-6 and their corresponding inverses PU-0B to PU-6B. In a similar fashion, a temperature value circuit 604 that can receive a temperature value, and in response thereto, output pull-down values PD-0 to PD-6 and corresponding inverses PD-0B to PD-6B.

An output driver portion 600 can also include a pull-up logic section 608 and pull-down logic section 610. A pull-up logic section 608 can receive pull-up values PU-0 and PU-1 as well as a master pull-up signal PUM. When master pull-up PUM signal is active (high in this example), a pull-up logic section 608 can activate an enable signal (ENU0) if pull-up value PU-0 is active, or can activate an enable signal (ENU1) if pull-up value PU-1 is active. Enable signals ENU0 and ENU1 are active low, in the example of FIG. 6A.

In a similar fashion, a pull-down logic section 610 can receive pull-down values PD-0B and PD-1B as well as a master pull-down signal PDM. When master pull-down signal is active (high in this example), a pull-down logic section 610 can activate an enable signal (END1) if pull-down value PD-0 is active, or can activate an enable signal (END1) if pull-down value PD-1 is active. Enable signals END0 and END1 are also active low.

Output driver portion 600 can also include a number of pull-up decoders 606-2 to 606-32. Each pull-up decoder (606-2 to 606-32) can activate a decoder output signal DECU2 to DECU32 (active low) in response to a particular combination of signals PU-3 to PU-6B.

Decoder output signals (DECU2 to DECU32) can be provided to decoder logic section 612. Decoder logic section 612 can also receive master pull-up signal PUM. In such an arrangement, when master pull-up signal PUM is active, an enable signal ENU2 to ENU32 can be activated in response to a corresponding decoder output signal DECU2 to DECU32 being activated.

Enable signals ENU0 to ENU32 can be applied to multi-stage pull-up driver 614. Multi-stage pull-up driver 614 can include a number of stages, each stage being enabled according to a particular enable signals (ENU0 to ENU32), and providing a different pull-up delay response. As but one example, each such stage can take the general form of the stage shown in FIG. 5, with each stage having a different option and hence a different pull-up resistance.

An output driver portion 600 can have a pull-down section that generally follows the pull-up section in structure. In detail, output driver portion 600 can include a number of pull-down decoders 616-2 to 616-32. Each pull-down decoder (616-2 to 616-32) can activate a decoder output signal DECD2 to DECD32 (active low) in response to a particular combination of signals PD-3 to PD-6B.

Decoder output signals (DECD2 to DECD32) can be provided to decoder logic section 618. Decoder logic section 618 can also receive master pull-down signal PDM. In such an arrangement, when master pull-down signal PDM is active, an enable signal END2 to END32 can be activated in response to a corresponding decoder output signal DECD2 to DECD32 being activated.

Enable signals END0 to END32 can be applied to multi-stage pull-down driver 620. Multi-stage pull-down driver 620 can include a number of stages, each stage being enabled according to a particular enable signals (END0 to END32), and providing a different pull-down delay response. As but one example, each such stage can take the general form of the stage shown in FIG. 5, however in a pull-down fashion (i.e., n-channel transistors pulling a data node down to a low potential via a selectable resistance). As such, enable signals END0 to END32 can be active high.

In this way, different delays for pull-up operations and/or pull-down operations can be accomplished with a multiple stages that operate in response to decoded temperature values.

Figure 7:
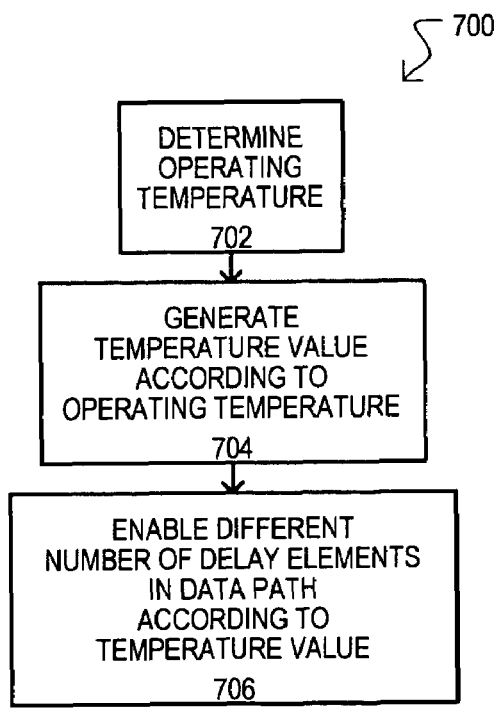
FIG. 7 is a flow diagram of a method according to one embodiment of the present invention.

While embodiments of the present invention can include circuits and systems as noted above, the present invention can also be include a method of operating a memory device. An embodiment of such a method is shown as 700 in FIG. 7.

A method 700 can include determining an operating temperature for a memory device (step 702). A temperature value can be generated according to a determined operating temperature (step 704). A different number of delay elements in a data path can then be enabled in response to each different temperature value (step 706).

The advantages of the architecture and methods of the present invention over previous or conventional memory devices can include: (i) the ability to substantially eliminate the dependence of the DVW on temperature; and (ii) the ability to implement higher data rate memory devices for high demand (wide range of operating conditions) applications. The architecture and method of the present invention may be particularly useful in high speed synchronous SRAMs.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method of accessing data stored in a semiconductor memory having a multi-stage input-output (I/O) buffer and a temperature compensated circuit, the method comprising steps of:
   sampling a temperature of the memory; and
   switching a number of delay elements in the I/O buffer into a data path situated between the memory and an output in response to the sampled temperature to output from the I/O buffer a data signal having a substantially constant data valid window (DVW) relative to a timing signal over variations in the temperature of the memory.

2. The method of claim 1, wherein:
   sampling the temperature of the memory includes generating a temperature value with an automatic temperature compensated circuit that automatically generates a temperature value; and
   the step of switching the number of delay elements includes enabling delay elements in response to the temperature value.

3. The method of claim 2, wherein:
   the temperature value is binary value; and
   the step of switching the number of delay elements includes decoding the binary value into a plurality of enable signals, and enabling the delay elements in response to the enable signals.

4. The method of claim 1, wherein:
the number of delay elements switched into the data path is inversely proportional to the sampled temperature of the device.

5. The method of claim 1, wherein:
the step of switching the number of delay elements in the I/O buffer includes coupling a predetermined resistance between a data output node and a power supply voltage.

6. The method of claim 5, wherein:
the resistance is inversely proportional to the sampled temperature of the device.

7. A method of operating a semiconductor memory, comprising the steps of:
generating a temperature value from the operating temperature of the semiconductor memory; and
enabling selected of a plurality of delay elements disposed in a data path to an outside connection of the semiconductor memory to compensate for changes in signal propagation time arising from variations in the operating temperature, the number of enabled devices corresponding to the generated temperature value.

8. The method of claim 7, wherein:
generating the temperature value includes,
monitoring a capacitor voltage, and if the capacitor voltage falls below a predetermined low voltage, increasing the amount of current supplied to the capacitor, and if the capacitor voltage rises above a predetermined high voltage, decreasing the amount of current supplied to the capacitor,
generating a periodic signal based on the rate at which the capacitor falls below the predetermined low voltage and rises above the predetermined high voltage, and
generating the temperature value from the periodic signal.

9. The method of claim 7, wherein:
the temperature value is a code; and
enabling the selected delay elements includes decoding the code into a plurality of decode signals, and enabling the selected delay elements in response to the decode signals.

10. The method of claim 7, wherein:
enabling the selected delay elements includes coupling a resistance between a data output node and a first power supply, the resistance being based on the temperature value.

11. The method of claim 7, further including:
providing a plurality of resistive paths between a data node and a power supply voltage, each resistive path comprising a different resistance value; and
the step of enabling selected of a plurality of delay elements includes enabling one of the resistive paths in response to the temperature value.

12. The method of claim 11, wherein:
the step of providing the plurality of resistive paths includes
forming a plurality of different resistor legs in parallel between a power supply node and a data output node, each resistor leg being separately enabled.

13. The method of claim 11, wherein:
the step of enabling selected of the plurality of delay elements includes in response to a pull-up signal, coupling a data output node to a first supply voltage via one of a plurality of pull-up resistive paths, each pull-up resistive path having a different resistance value.

14. A semiconductor memory, comprising:
a multi-stage data buffer having a plurality of delay elements therein, different delay elements being switched into a data path in response to switch control signals; and
a temperature compensation circuit comprising,
a temperature sampling section that samples a temperature of the semiconductor memory device, and
a switch control circuit that generates switch control signals that vary according to the sampled temperature to introduce a delay into a data path to provide a substantially constant data valid window relative to a data request in response to variations in the sampled temperature.

15. The semiconductor memory of claim 14, wherein:
the multi-stage data buffer is formed on a first semiconductor substrate; and
the temperature compensation circuit is formed on a separate second substrate adjacent to the first substrate and formed in the same integrated circuit package as the first semiconductor substrate.

16. The semiconductor memory of claim 14, wherein:
the multi-state data buffer and the temperature compensated circuit are formed on the same substrate.

17. The semiconductor memory of claim 14, wherein:
the switch control circuit generates switch control signals that switch a first number of delay elements into the data path when the sampled temperature is a first temperature, and generates switch control signals that switch a second number of delay elements into the data path when the sampled temperature is a second temperature lower than the first temperature, the second number of delay elements being greater than the first number of delay elements.

18. The semiconductor memory of claim 14, further including:
a decoder coupled between the multi-stage data buffer and the temperature compensation circuit that decodes switch control signals to generate switch activation signals, each switch activation signal switching a different number of delay elements into the data path.

19. The semiconductor memory of claim 18, wherein:
the switch control circuit generates a different set of switch control signal values, each corresponding to a different range of temperatures; and
the decoder switch activation signals each correspond to one of the temperature ranges.

20. The semiconductor memory of claim 18, wherein:
the multi-stage data buffer comprises a plurality of delay sections, each delay section including a plurality of resistive elements coupled between a data node and a power supply voltage, the overall effective resistance of the resistance elements for each delay section being different.

* * * * *